United States Patent
Ahn et al.

(10) Patent No.: US 11,145,785 B2
(45) Date of Patent: Oct. 12, 2021

(54) HYBRID TYPE SEMICONDUCTOR LIGHT EMITTING DEVICE AND MANUFACTURING METHOD THEREOF

(71) Applicant: PETALUX INC., Seongnam-si (KR)

(72) Inventors: Do Yeol Ahn, Seoul (KR); Seung Hyun Yang, Yongin-si (KR)

(73) Assignee: PETALUX INC., Seongnam-si (KR)

( * ) Notice: Subject to any disclaimer, the term of this patent is extended or adjusted under 35 U.S.C. 154(b) by 0 days.

(21) Appl. No.: 16/309,321

(22) PCT Filed: Jun. 12, 2017

(86) PCT No.: PCT/KR2017/006052
§ 371 (c)(1),
(2) Date: Dec. 12, 2018

(87) PCT Pub. No.: WO2017/217706
PCT Pub. Date: Dec. 21, 2017

(65) Prior Publication Data
US 2019/0189832 A1 Jun. 20, 2019

(30) Foreign Application Priority Data
Jun. 13, 2016 (KR) .................. 10-2016-0073017

(51) Int. Cl.
*H01L 33/26* (2010.01)
*H01L 33/00* (2010.01)
(Continued)

(52) U.S. Cl.
CPC ............ *H01L 33/002* (2013.01); *H01L 33/00* (2013.01); *H01L 33/005* (2013.01); *H01L 33/26* (2013.01);
(Continued)

(58) Field of Classification Search
CPC .............................................. H01L 33/00–648
See application file for complete search history.

(56) References Cited

U.S. PATENT DOCUMENTS

| | | | |
|---|---|---|---|
| 6,309,459 B1 * | 10/2001 | Yuge ...................... | C30B 25/02 117/105 |
| 6,563,850 B1 * | 5/2003 | Matsumoto ............ | B82Y 20/00 257/E33.008 |

(Continued)

FOREIGN PATENT DOCUMENTS

| | | |
|---|---|---|
| JP | 11-87778 | 3/1999 |
| JP | 11-195808 | 7/1999 |

(Continued)

OTHER PUBLICATIONS

Extended European search report, corresponding to European Application No. 17813530.7, dated Feb. 3, 2020.
International Preliminary Report on Patentability dated Dec. 18, 2018 and English Translation of Written Opinion of the International Searching Authority dated Oct. 18, 2017 associated with International Application No. PCT/KR2017/006052.
(Continued)

*Primary Examiner* — Suberr L Chi
(74) *Attorney, Agent, or Firm* — Kile Park Reed & Houtteman PLLC

(57) ABSTRACT

The present invention provides a semiconductor light emitting device including a substrate, a first semiconductor layer, a first cladding layer, an active layer, a second cladding layer and a second semiconductor layer, and a manufacturing method. The first semiconductor layer may be an n-type semiconductor including a III-V semiconductor or a II-VI semiconductor. The second semiconductor layer may be a p-type semiconductor including a I-VII semiconductor. The semiconductor light emitting device may further include a third cladding layer between the active layer and the second cladding layer, the third cladding layer including a III-V semiconductor or a II-VI semiconductor. Therefore, by providing the hybrid type semiconductor light emitting
(Continued)

device and the manufacturing method thereof, the luminous efficiency limit of the p-type semiconductor can be overcome.

12 Claims, 4 Drawing Sheets

(51) Int. Cl.
*H01L 33/50* (2010.01)
*H01L 33/28* (2010.01)
*H01L 33/40* (2010.01)
*H01L 33/30* (2010.01)
*H01L 33/42* (2010.01)

(52) U.S. Cl.
CPC .............. *H01L 33/28* (2013.01); *H01L 33/30* (2013.01); *H01L 33/40* (2013.01); *H01L 33/42* (2013.01); *H01L 33/50* (2013.01)

(56) References Cited

U.S. PATENT DOCUMENTS

| | | | |
|---|---|---|---|
| 2011/0114995 A1* | 5/2011 | Ahn | ........................ H01L 33/26 |
| | | | 257/103 |
| 2011/0177642 A1 | 7/2011 | Kusunoki | |
| 2011/0204483 A1 | 8/2011 | McNally et al. | |
| 2015/0055337 A1* | 2/2015 | Lin | ........................ H01L 33/50 |
| | | | 362/231 |

FOREIGN PATENT DOCUMENTS

| | | |
|---|---|---|
| JP | 2005-005518 | 1/2005 |
| JP | 2005-117020 | 4/2005 |
| JP | 2009200251 | 9/2009 |
| KR | 10-2012-0057646 | 6/2012 |
| KR | 10-2013-0006810 | 1/2013 |
| KR | 10-2015-0103562 | 9/2015 |

OTHER PUBLICATIONS

International Search Report for International Application No. PCT/KR2017/006052; dated Oct. 18, 2017.

* cited by examiner

HYBRID TYPE SEMICONDUCTOR LIGHT EMITTING DEVICE AND MANUFACTURING METHOD THEREOF

TECHNICAL FIELD

The present invention relates to a semiconductor light emitting device, and more particularly, the present invention relates to a semiconductor light emitting device using I-VII semiconductor and a manufacturing method.

BACKGROUND ART

Among single element semiconductors, Si semiconductors, which have been developed and commercialized since the 1950s, have advantages such as low cost of materials, easy obtaining Si-oxide through thermal oxidation, and easy manufacturing a stable surface protective film. Therefore, it meets the characteristics required by all devices. However, it is difficult to grow a large-sized single crystal, and since the band gap is as small as 1.1 eV, it is not suitable as a semiconductor device requiring high thermal stability and high efficiency. Further, is is not suitable for the function of a wide band gap (WBG) semiconductor.

Recently, as an alternative material, III-V semiconductors and II-VI semiconductors with wide bandgap are worthy of high-power, high-frequency electronic devices. However, due to the difference in vapor pressure between the III-V semiconductor and the II-VI semiconductor constituent elements, a single crystal of n-type semiconductor is usually grown, and a p-type single crystal is hardly grown to form a PN junction. Therefore, Mg doping is generally required to form a p-type semiconductor, and the Mg-doped III-V semiconductor or II-VI semiconductor has poor performance of the p-type semiconductor due to hydrogen bonding. In addition, strong chemical bonding forces serve as disadvantages, making crystal growth and device processing difficult. Due to these phenomena, wide bandgap semiconductors are limited in application to various fields.

DETAILED DESCRIPTION OF THE INVENTION

Objects of the Invention

Accordingly, it is an object of the present invention to provide a hybrid type semiconductor light emitting device and a method of manufacturing the same, overcoming the application limitations of a p-type semiconductor of a wide bandgap semiconductor and improving the luminous efficiency.

Technical Solution

In order to solve such a problem, a semiconductor light emitting device according to the present invention may include a substrate, a first semiconductor layer, a first cladding layer, an active layer, a second cladding layer and a second semiconductor layer. The first semiconductor layer may be formed on the substrate, and the first semiconductor layer may include a III-V semiconductor or a II-VI semiconductor. The first cladding layer may beformed on the first semiconductor layer. The active layer may be formed on the first cladding layer, and the active layer may include a III-V semiconductor or a II-VI semiconductor. The second cladding layer may be formed on the active layer. The second semiconductor layer may be formed on the second cladding layer, the second semiconductor layer including a I-VII semiconductor.

The first semiconductor layer may be an n-type semiconductor, and the second semiconductor layer may be a p-type semiconductor layer.

The first cladding layer may include a III-V semiconductor or a II-VI semiconductor.

The second cladding layer may include a I-VII semiconductor.

The semiconductor light emitting device may further comprise a third cladding layer between the active layer and the second cladding layer, and the third cladding layer may include a III-V semiconductor or a II-VI semiconductor.

The semiconductor light emitting device may further comprise a transparent electrode formed on the second semiconductor layer.

A light emitting diode according to a present invention may comprise a semiconductor device and a light conversion layer containing a phosphor. The semiconductor device may comprise a substrate, an n-type semiconductor layer, a first cladding layer, an active layer, a second cladding layer and a p-type semiconductor layer. The n-type semiconductor layer may be formed on the substrate, and the n-type semiconductor layer may include a III-V semiconductor or a II-VI semiconductor. The first cladding layer may formed on the n-type semiconductor layer, and the first cladding layer may include a III-V semiconductor or a II-VI semiconductor. The active layer may be formed on the first cladding layer, and the active layer may include a III-V semiconductor or a II-VI semiconductor. The second cladding layer may be formed on the active layer, and the second cladding layer may include a I-VII semiconductor. The p-type semiconductor layer may be formed on the second cladding layer, and the p-type semiconductor layer may include a I-VII semiconductor.

The light emitting diode may further comprise a third cladding layer between the active layer and the second cladding layer, and the third cladding layer may include a III-V semiconductor or a II-VI semiconductor.

A method of manufacturing a semiconductor light emitting device according to the present invention, may comprise preparing a substrate, forming an n-type semiconductor on the substrate, the n-type semiconductor including a III-V semiconductor or a II-VI semiconductor material, forming a first cladding layer on the n-type semiconductor, the first cladding layer including a III-V semiconductor or a II-VI semiconductor material, forming an active layer on the first cladding layer, the active layer including a III-V semiconductor or a II-VI semiconductor material, forming a second cladding layer on the active layer, the second cladding layer including an I-VII semiconductor, and forming a p-type semiconductor on the second cladding layer, the p-type semiconductor including an I-VII semiconductor.

The method of manufacturing a semiconductor light emitting device may further comprise forming a third cladding layer between forming the active layer and the forming the second cladding layer, the third cladding layer including a III-V semiconductor or a II-VI semi conductor material.

The I-VII semiconductor may be any one of CuCl, CuBr, CuI and AgI, or a combination of two or more thereof.

The III-V semiconductor may be any one of GaN, GaP, GaAs, InP, AlGaN, AlGaP, AlInGaN, InGaAs and GaAsP or a combination of two or more thereof.

The II-VI semiconductor may be any one of CdO, CdS, CdSe, CdTe, ZnO, ZnS, ZnSe, ZnTe, CdZnTe, HgCdTe and HgZnTe or a combination of two or more thereof.

Advantageous Effects

According to the semiconductor light emitting device, the light emitting diode and the semiconductor manufacturing method according to the present invention, since the semiconductor is grown naturally without forming a separate doping process when forming the p-type semiconductor, it can be advantageous for forming a high purity single crystal. In addition, defects due to lattice mismatch with the substrate can be solved inherently.

In addition, since the I-VII semiconductor can grow crystals at a low temperature, the process is easy and the material stability can be secured.

Further, it is possible to emit light in a wide wavelength range, and a wavelength range can be selected depending on the application. In addition, semiconductor industry can be diversified and various needs can be met.

MODE FOR INVENTION

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art.

It will be understood that, although the terms first, second, etc. may be used herein to describe various elements, components, regions, layers and/or sections, these elements, components, and/or sections should not be limited by these terms. These terms are only used to distinguish one element, component, region, layer or section from another region, layer or section. Thus, a first element, component, or section discussed below could be termed a second element, component, or section without departing from the teachings of the present invention.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, preferred embodiments of the present invention will be described in detail with reference to the drawings.

Figure 2:
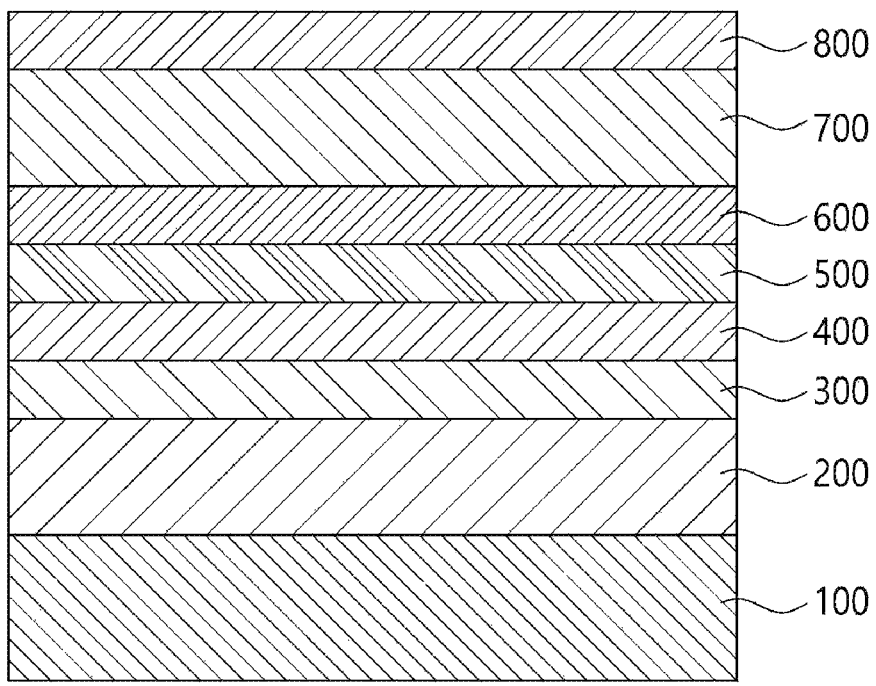
FIG. 2 is a cross-sectional view of a light emitting device according to an exemplary embodiment of the present invention.
Figure 3:
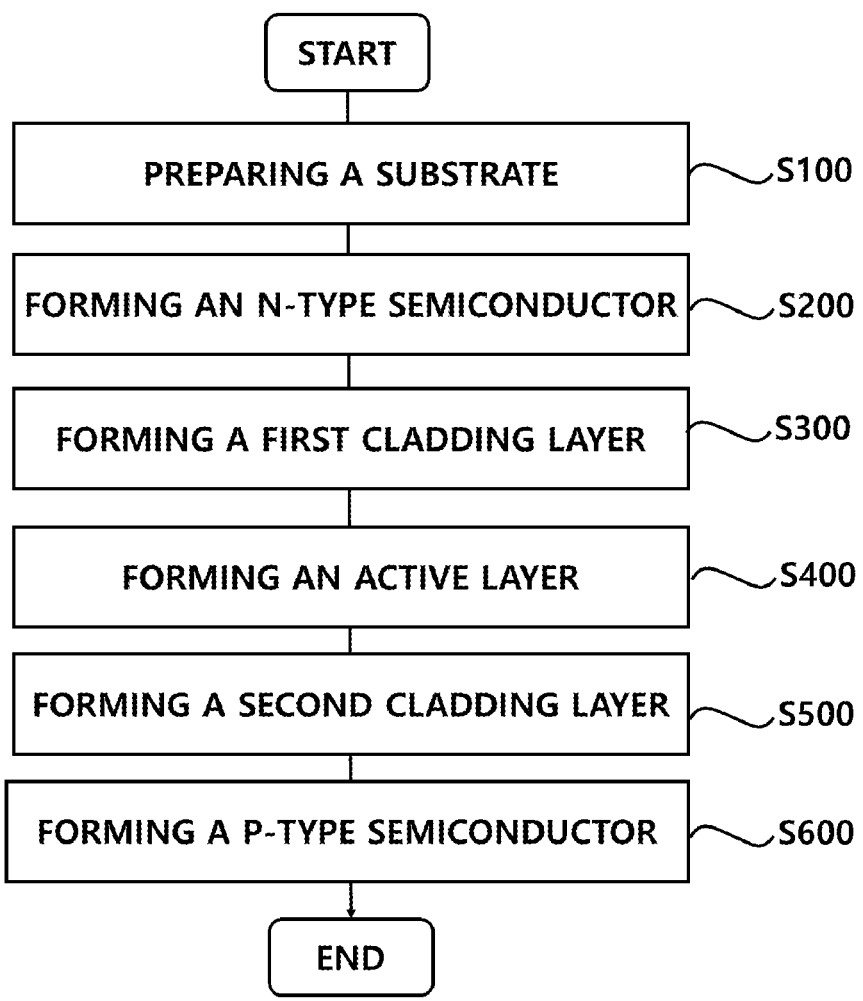
FIG. 3 is a flowchart of a method of manufacturing a light emitting device according to an exemplary embodiment of the present invention.

FIG. 2 is a cross-sectional view of a semiconductor light emitting device 1000 according to the present invention.

Referring to FIG. 2, a semiconductor light emitting device 1000 according to the present invention may include a substrate 100, a first semiconductor layer 200, a first cladding layer 300, an active layer 400, a second cladding layer 600 and a second semiconductor layer 700. The first semiconductor layer 200 is formed on the substrate 100 and may include a III-V semiconductor or a II-VI semiconductor. The first cladding layer 300 may be formed on the first semiconductor layer 200. In addition, the active layer 400 may be formed on the first cladding layer 300 and may include a III-V semiconductor or a II-VI semiconductor. In addition, the second cladding layer 600 may be formed on the active layer 400. In addition, the second semiconductor layer 700 may be formed of an I-VII semiconductor on the second cladding layer 600.

Also, the first semiconductor layer 200 may be an n-type semiconductor, and the second semiconductor layer 700 may be a p-type semiconductor. In general, a III-V semiconductor or a II-VI semiconductor is mainly used for forming a wide band gap semiconductor, and in order to form a p-type semiconductor from the III-V semiconductor and the II-VI semiconductor, impurity doping is inevitable. Further, when the p-type semiconductor is formed by Mg-doping the III-V semiconductor and the II-VI semiconductor, the hole generating ability is deteriorated due to strong hydrogen bonding and the light efficiency is decreased.

Figure 1:
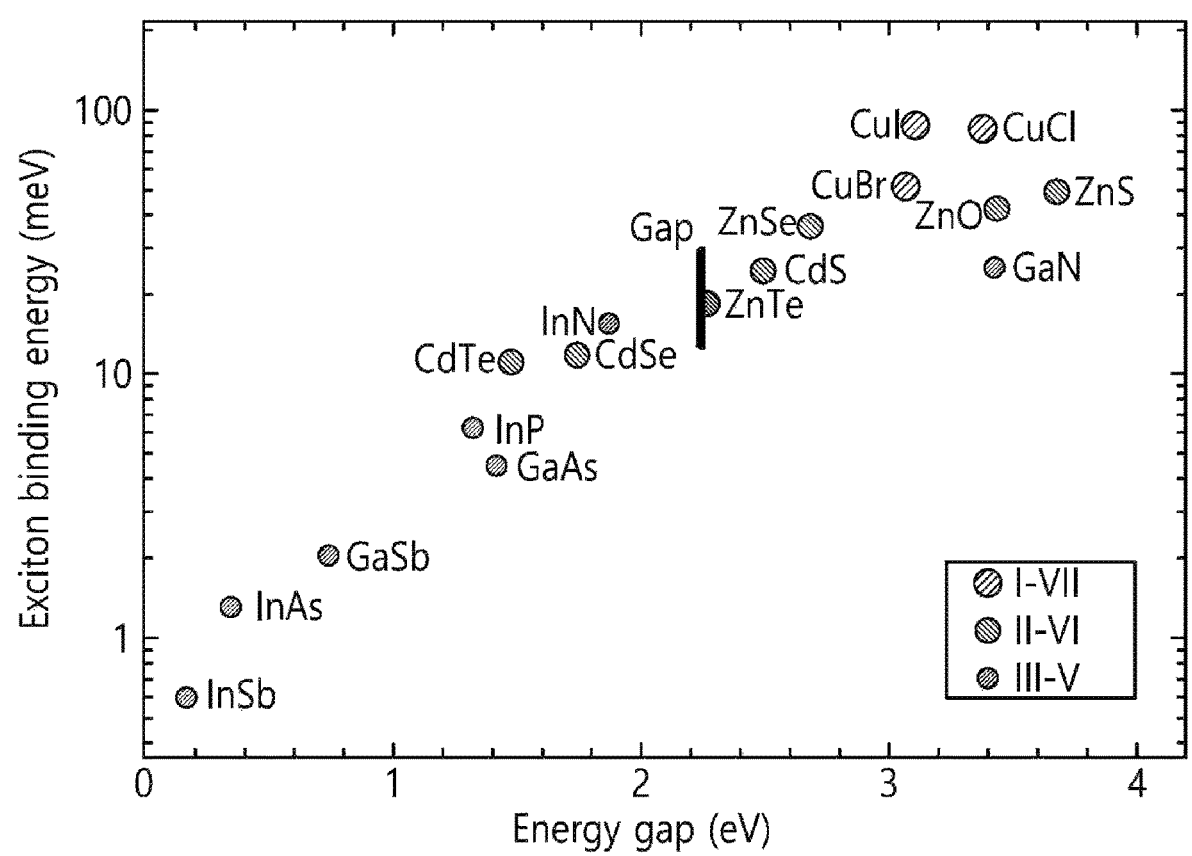
FIG. 1 is a graph showing the characteristics of the I-VII semiconductor, III-V semiconductor, and II-VI semiconductor.

However, since the p-type semiconductor is formed only by the crystal growth of the I-VII semiconductor, the process is easy and the growth temperature is relatively low as 400° C. to 600° C. In addition, referring to FIG. 1, since the I-VII semiconductor has a larger band gap energy than the III-V semiconductor and the II-VI semiconductor, the light efficiency is high.

In addition, the first cladding layer 300 may be formed of a III-V semiconductor or a II-VI semiconductor. In addition, the second cladding layer 600 may be formed of a Group I-VII semi conductor.

Generally, since the drift velocity of electrons in a semiconductor device is very fast compared to the drift velocity of holes, an electron surplus phenomenon occurs in the p-type semiconductor. This causes a phenomenon of lowering the light efficiency. When the first cladding layer 300 and the second cladding layer 600 are formed as the present invention, the above phenomenon may be overcome.

The semiconductor light emitting device 1000 may further include a third cladding layer 500 between the active layer 400 and the second cladding layer 600, and the third cladding layer 500 may include a III-V semiconductor material or a II-VI semiconductor material.

Heterojunctions that bond two different semiconductor materials have different energy gaps, resulting in discontinuity of energy bands at the junction interface. Because of this, there is a limit in selecting the material and there is a difficulty in solving the stair-joining problem in order for the lattice constants to fit well. However, according to the semiconductor light emitting device 1000, the third cladding layer 500 including a III-V semiconductor material or a II-VI semiconductor material is formed to be a buffer for hetero-epitaxial growth. By growing the I-VII semiconductor on the third cladding layer 500, defects due to lattice mismatching can be inherently solved.

In addition, a transparent electrode layer 800 may be further formed on the second semiconductor layer.

The transparent electrode layer 800 may be formed of any one of Ni/Au, ITO, CTO, TiWN, $IN_2O_3$, $SnO_2$, CdO, ZnO, $CuGaO_2$ and $SrCu_2O_2$.

In addition, the semiconductor light emitting device 1000 according to the present invention may further include a phosphor layer, and the semiconductor light emitting device 1000 is applicable to products in various lighting and displays.

The light emitting diode according to the present invention may include a light conversion layer including a semiconductor element and a phosphor. The semiconductor device may include a substrate, an n-type semiconductor layer, a first cladding layer, an active layer, a second cladding layer and a p-type semiconductor layer. At this time, the n-type semiconductor layer may be formed of a III-V semiconductor or a II-VI semiconductor on a substrate. The first cladding layer may be formed of a III-V semiconductor or a II-VI semiconductor on the n-type semiconductor layer. In addition, the active layer may be formed of a III-V semiconductor or a II-VI semiconductor on the first cladding layer. The second cladding layer may be formed of an I-VII semiconductor on the active layer. In addition, the p-type semiconductor layer may be formed of an I-VII semiconductor on the second cladding layer.

The light emitting diode may further include a third cladding layer between the active layer and the second cladding layer, and the third cladding layer may be formed of a III-V semiconductor or a II-VI semiconductor.

A method for fabricating a semiconductor light emitting device (S1000) of the present invention, may include a step of preparing a substrate (S100), a step of forming an n-type semiconductor (S200), a step of forming a first cladding layer (S300), a step of orming an active layer (S400), a step of forming a second cladding layer (S500), and a step of forming a p-type semiconductor (S600). In the step of forming the n-type semiconductor (S200), the n-type semiconductor may include a III-V semiconductor or a II-VI semiconductor material, and may be formed on the substrate. In the step of the forming of the first cladding layer (S300), the first cladding layer may be performed on the n-type semiconductor. In the step of forming the active layer (S400), the active layer may be formed on the first cladding layer, and the active layer may include a III-V semiconductor or a II-VI semiconductor material. In the step of forming the second cladding layer (S500), the second cladding layer may be formed on the active layer. In the step of forming the p-type semiconductor (S600), the p-type semiconductor may be formed on the second cladding layer, and the p-type semiconductor may include the I-VII semi conductor.

The method for manufacturing a semiconductor light emitting device may further include forming a third cladding layer between the step of forming of the active layer (S400) and the step of forming of the second cladding layer (S500). The third cladding layer may include a III-V semiconductor or a II-VI semiconductor material.

In addition, according to the method of manufacturing a semiconductor light emitting device (S1000), each step may sequentially or at least two steps be performed simultaneously, but the order is not limited.

In addition, in the step of forming of the p-type semiconductor, a I-VII semiconductor may be deposited through a physical vapor deposition (PVD) or a chemical vapor deposition (CVD) method. In addition, in the step of forming of the p-type semiconductor, a I-VII semiconductors may be deposited to grow crystals in a range of a temperature of 400° C. to 600° C.

In addition, the I-VII semiconductor may be formed of any one of CuCl, CuBr, CuI and AgI, or a combination of two or more thereof. In addition, CuCl is a direct band gap semiconductor having a band gap of 3.3 eV and has a band gap in the ultraviolet region, so that it is transparent in the visible light region and can be applied to a display application.

The III-V semiconductor may be formed of any one of GaN, GaP, GaAs, InP, AlGaN, AlGaP, AlInGaN, InGaAs and GaAsP or a combination of two or more thereof.

The II-VI semiconductor may be formed of any one of CdO, CdS, CdSe, CdTe, ZnO, ZnS, ZnSe, ZnTe, CdZnTe, HgCdTe and HgZnTe or a combination of two or more thereof.

Figure 4:
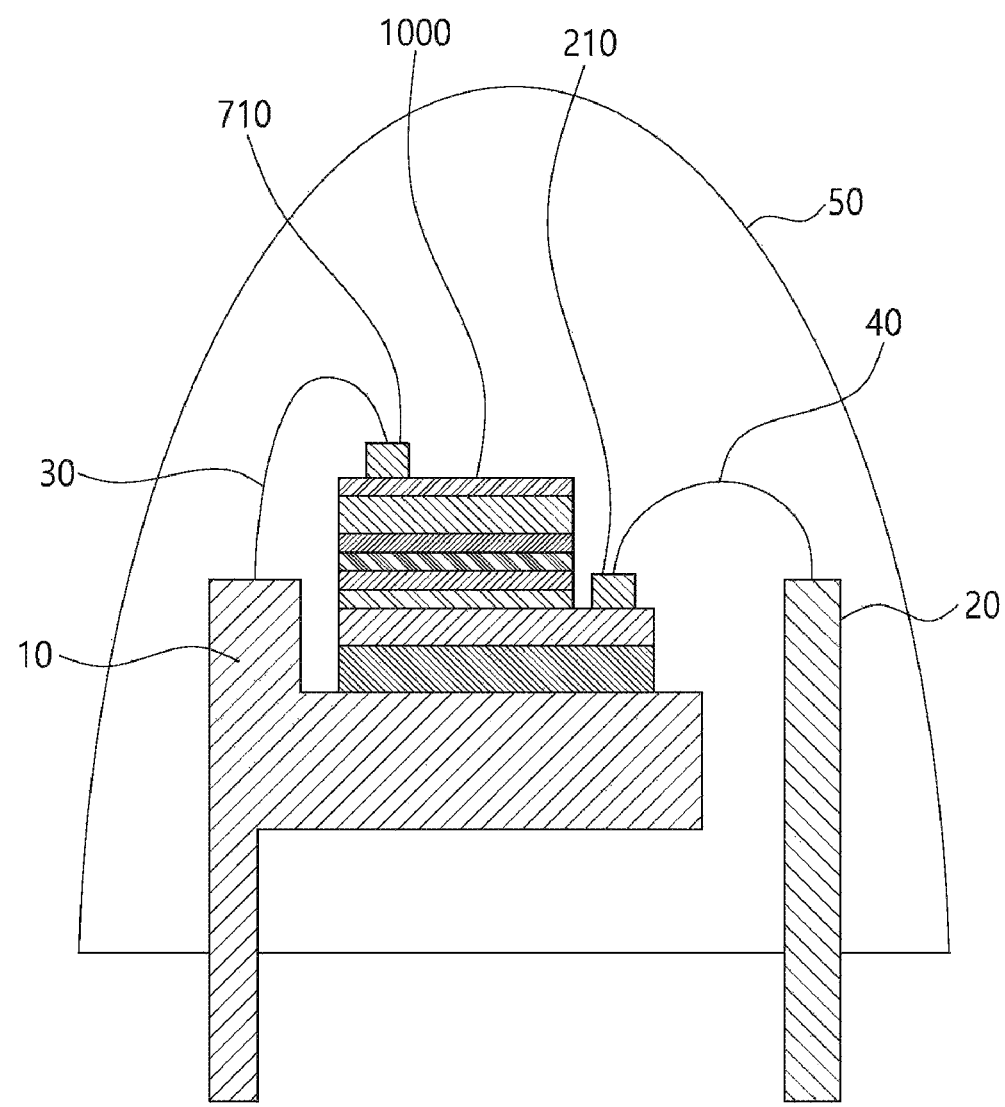
FIG. 4 is a cross-sectional view showing an exemplary embodiment of an LED to which the semiconductor light emitting device of the present invention is applied.

FIG. 4 is a cross-sectional view illustrating an exemplary embodiment of an LED (Light Emitting Diode) manufactured by the semiconductor light emitting device, the light emitting diode, and the semiconductor manufacturing method of the present invention.

Referring to FIG. 4, the semiconductor light emitting device 1000 according to the present invention can be mounted in an LED. The semiconductor light emitting device 1000 may be bonded to a first frame 10 and the first electrode 210 of the semiconductor light emitting device 1000 may be bonded to a second frame 20 by a second wire 40. The second electrode 710 of the apparatus 1000 may be bonded to the the first frame 10 by a first wire 30. Then, the LED may be manufactured by molding the periphery with a housing 50 made of a transparent resin.

In addition, the semiconductor light emitting device 1000, the semiconductor light emitting diode, and the method for manufacturing a semiconductor light emitting device (S1000) according to the present invention, can be applied to various display products and can be applied to solar batteries and batteries for electric vehicles.

Although the present invention has been described in the detailed description of the invention with reference to exemplary embodiments of the present invention, it will be understood to those skilled in the art that various modifications and variation can be made in the present invention without departing from the spirit or scope of the invention.

The invention claimed is:

1. A semiconductor light emitting device comprising:
   a substrate;
   a first semiconductor layer formed on the substrate, the first semiconductor layer including a II-VI semiconductor;
   a first cladding layer formed on the first semiconductor layer;
   an active layer formed on the first cladding layer, the active layer including a II-VI semiconductor;
   a second cladding layer formed on the active layer; and
   a second semiconductor layer formed on the second cladding layer, the second semiconductor layer including a I-VII semiconductor.

2. The semiconductor light emitting device of claim 1, the first semiconductor layer is an n-type semiconductor, and the second semiconductor layer is a p-type semiconductor layer.

3. The semiconductor light emitting device of claim 1, wherein the first cladding layer includes a II-VI semiconductor.

4. The semiconductor light emitting device of claim 1, wherein the second cladding layer includes a I-VII semiconductor.

5. The semiconductor light emitting device of claim 1, further comprising a third cladding layer between the active layer and the second cladding layer, the third cladding layer including a II-VI semiconductor.

6. The semiconductor light emitting device of claim 1, wherein the I-VII semiconductor is any one of CuCl, CuBr, CuI and AgI, or a combination of two or more thereof.

7. The semiconductor light emitting device of claim 1, wherein the II-VI semiconductor is any one of CdO, CdS, CdSe, CdTe, ZnO, ZnS, ZnSe, ZnTe, CdZnTe, HgCdTe and HgZnTe or a combination of two or more thereof.

8. The semiconductor light emitting device of claim 1, further comprising a transparent electrode formed on the second semiconductor layer.

9. A light emitting diode comprising:

a semiconductor device; and a light conversion layer containing a phosphor, wherein the semiconductor device comprising:

a substrate;

an n-type semiconductor layer formed on the substrate, the n-type semiconductor layer including a II-VI semiconductor;

a first cladding layer formed on the n-type semiconductor layer, the first cladding layer including a II-VI semiconductor;

an active layer formed on the first cladding layer, the active layer including a II-VI semiconductor;

a second cladding layer formed on the active layer, the second cladding layer including a I-VII semiconductor; and a p-type semiconductor layer formed on the second cladding layer, the p-type semiconductor layer including a I-VII semiconductor.

10. The light emitting diode of claim 9, further comprising a third cladding layer between the active layer and the second cladding layer, the third cladding layer including a II-VI semiconductor.

11. The light emitting diode of claim 9, wherein the I-VII semiconductor is any one of CuCl, CuBr, CuI and AgI, or a combination of two or more thereof.

12. The light emitting diode of claim 9, wherein the II-VI semiconductor is any one of CdO, CdS, CdSe, CdTe, ZnO, ZnS, ZnSe, ZnTe, CdZnTe, HgCdTe and HgZnTe or a combination of two or more thereof.

* * * * *